United States Patent [19]

Wang et al.

[11] Patent Number: 4,958,086
[45] Date of Patent: Sep. 18, 1990

[54] LOW DI/DT OUTPUT BUFFER WITH IMPROVED SPEED

[75] Inventors: Karl L. Wang; Taisheng Feng, both of Austin, Tex.

[73] Assignee: Motorola, Inc., Schaumburg, Ill.

[21] Appl. No.: 348,357

[22] Filed: May 8, 1989

[51] Int. Cl.$^5$ .................. H03K 4/94; H03K 17/16
[52] U.S. Cl. .................. 307/296.8; 307/443; 307/296.6; 323/312; 323/314; 323/315
[58] Field of Search .............. 307/443, 270, 263, 264, 307/296.8, 296.6, 296.2; 323/314, 313

[56] References Cited

U.S. PATENT DOCUMENTS

| | | | |
|---|---|---|---|
| 4,287,467 | 9/1981 | Gloaguen | 323/314 |
| 4,716,372 | 12/1987 | Fauser et al. | 307/296.6 |
| 4,724,340 | 2/1988 | Sood | 307/443 |
| 4,758,743 | 7/1988 | Dehganpour et al. | 307/443 |
| 4,797,579 | 1/1989 | Lewis | 307/443 |
| 4,800,298 | 1/1989 | Yu et al. | 307/443 |
| 4,827,205 | 5/1989 | Hafner et al. | 323/314 |
| 4,837,460 | 6/1989 | Uchida | 307/296.2 |

OTHER PUBLICATIONS

"A 21-ns 32K×8 CMOS Static Ram with a Selectively Pumped p-Well Array" by Karl Wang et al., IEEE Journal of Solid State Circuits, vol. SC-22, No. 5, Oct. 1987.

Primary Examiner—Stanley D. Miller
Assistant Examiner—Hanh Nguyen
Attorney, Agent, or Firm—James C. Clingan, Jr.; Paul J. Polansky

[57] ABSTRACT

An output buffer in an integrated circuit comprising voltage regulator, a predriver, and an output stage. The integrated circuit comprises a chip and a package and interconnections therebetween. The voltage regulator is coupled to a first power supply voltage terminal and a second power supply voltage terminal, and provides a regulated voltage signal characterized as having a constant voltage substantially independent of fluctuations in voltage between the first power supply voltage terminal and the second power supply voltage terminal. The predriver receives the regulated voltage signal and a data input signal and provides a regulated predriven signal in response to the data signal. The output stage receives the regulated predriven signal and provides an output signal in response thereto. The output signal is driven onto a bonding pad of the device to provide an interconnection point between the chip and the package.

11 Claims, 2 Drawing Sheets

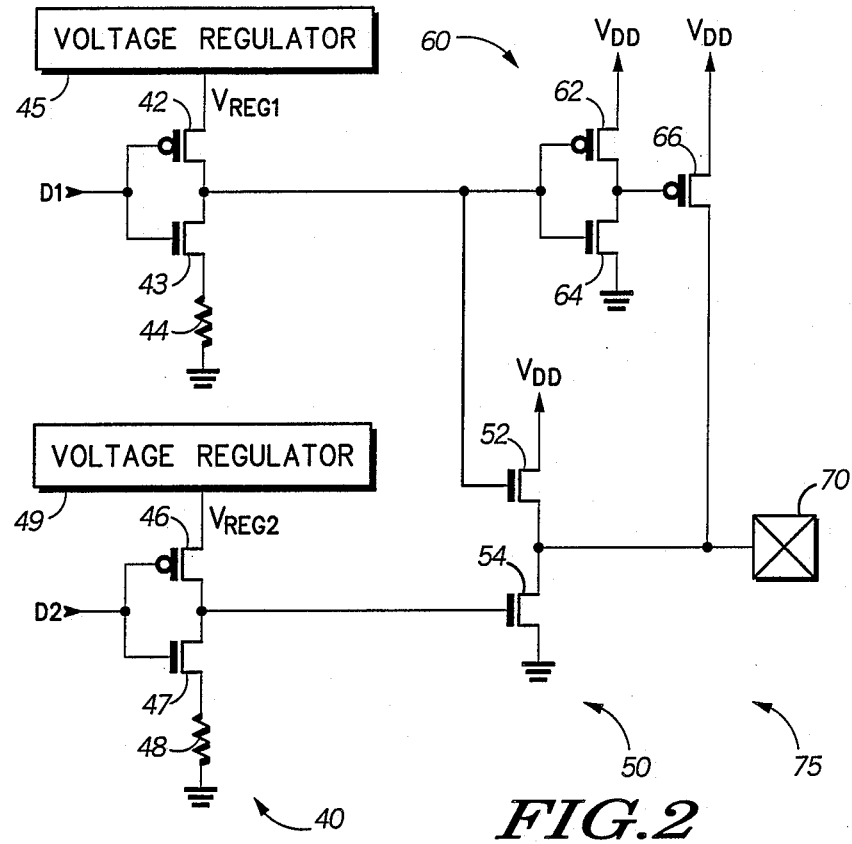
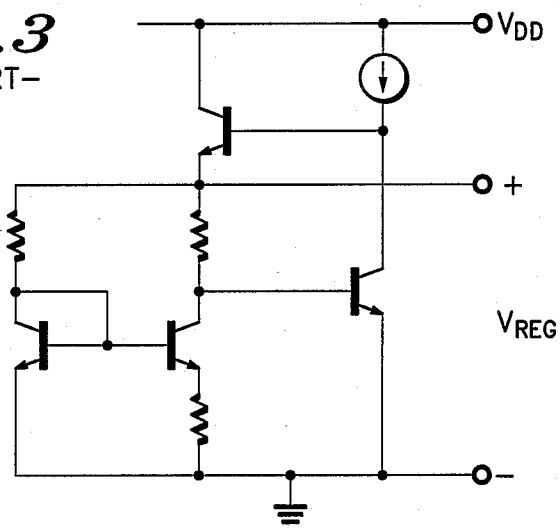
FIG.3
-PRIOR ART-

LOW DI/DT OUTPUT BUFFER WITH IMPROVED SPEED

FIELD OF THE INVENTION

This invention relates generally to buffers, and more particularly, to high-speed output buffers for switching large capacitive loads.

BACKGROUND OF THE INVENTION

In integrated circuits, there is generally a piece of silicon known as a die or chip which contains electrical circuits and which is connected to a lead frame. The chip has bonding pads which are connected to the lead frame by tiny wires. The lead frame has leads which are used for connecting to a printed circuit board as part of a larger system. The leads of the lead frame have a certain amount of inductance as well as capacitance and resistance. There is also some inductance in the wire from the bonding pad to the lead frame. The wire inductance, however, is significantly less than that of the lead frame. The connection of a lead of the lead frame to a circuit board also adds some inductance. As the switching speeds of integrated circuits have increased, this cumulative inductance has begun to have an impact on the performance of the integrated circuit.

Of course it is desirable to have integrated circuits which are very fast. The increased switching speed has also increased the rate at which current changes. This increased rate of current change causes a voltage drop across the inductance. The voltage across an inductance is equal to the inductance times the time rate of change of the current through that inductance. This is expressed as Ldi/dt, where L is the inductance and di/dt is the time rate of change of the current. As the di/dt becomes larger, the voltage across the inductance becomes larger. This voltage drop across an inductance causes a voltage differential between the lead location on the circuit board and the bonding pad to which it is connected on the integrated circuit. This can create a problem of having the internal supply at a different voltage than the voltage of the external supply. This problem can cause the internal supply voltages to differ by so much from their external levels that signals input to the chip are recognized incorrectly.

FIG. 1 shows a conventional output buffer 35 designed to reduce di/dt and a bonding pad 30 to which it couples its output. (See Wang, Karl L., et. al., "A 21-ns 32K×8 CMOS Static RAM with a Selectively Pumped p-Well Array," *IEEE Journal of Solid-State Circuits*, vol. SC-22, no. 5, Oct. 1987.) Output buffer 35 generally comprises a predriver section 10 and an output stage 20. Predriver section 10 comprises a resistor 11, a P-channel transistor 12, an N-channel transistor 13, a resistor 14, a resistor 15, a P-channel transistor 16, an N-channel transistor 17, and a resistor 18. Output stage 20 comprises an N-channel transistor 22, and an N-channel transistor 24.

Resistor 11 has a first terminal connected to a positive power supply voltage terminal $V_{DD}$, and a second terminal. Transistor 12 has a source connected to the second terminal of resistor 11, a gate for receiving an input signal D1, and a drain for providing a first predriven signal. Transistor 13 has a drain connected to the drain of transistor 12, a gate for receiving input signal D1, and a source. Resistor 14 has a first terminal connected to the source of transistor 13, and a second terminal connected to a negative power supply voltage terminal $V_{SS}$.

Resistor 15 has a first terminal connected to $V_{DD}$, and a second terminal. Transistor 16 has a source connected to the second terminal of resistor 15, a gate for receiving a second input signal D2, and a drain for providing a second predriven signal. Transistor 17 has a drain connected to the drain of transistor 16, a gate for receiving D2, and a source. Resistor 18 has a first terminal connected to the source of transistor 17, and a second terminal connected to $V_{SS}$.

In output stage 20, an transistor 22 has a drain connected to $V_{DD}$, a gate for receiving the first predriven signal, and a source connected to bonding pad 30. Transistor 24 has a drain connected to the source of transistor 22 and to bonding pad 30, a gate for receiving the second predriven signal, and a source connected to $V_{SS}$.

In operation, output buffer 35 limits the Ldi/dt voltage drop in the bonding wire, lead frame, and connection to a printed circuit board by using resistors 11, 14, 15, and 18 to limit the di/dt. D1 and D2 are digital signals which assume either a logic high or a logic low. In a typical embodiment when data is to be driven externally, D1 and D2 are complementary and provide a single output data signal, but when no data is to be driven externally, D1 and D2 are both at a high voltage, which places bonding pad 30 in a high impedance state. Another possible embodiment is that D1 and D2 are always complementary signals.

If D1 and D2 are assumed to be complementary, consider a case in which D1 switches from a logic low to a logic high and D2 switches from a logic high to a logic low. When a logic low is present on D1, transistor 12 is conductive and transistor 13 is nonconductive. In a steady-state condition, no current flows through resistor 11 and transistor 12 and the gate of transistor 22 is held at a high voltage. Similarly, when a logic high is present on D2, transistor 16 is nonconductive and transistor 17 is conductive. In the steady-state condition, no current flows through resistor 18 and transistor 17 and the gate of transistor 24 is held at a low voltage. So transistor 22 is conductive and transistor 24 is nonconductive, driving the value on bonding pad 30 to a logic high.

When D1 switches to a logic high and D2 switches to a logic low, the logic high on D1 makes transistor 12 nonconductive and transistor 13 conductive. As transistor 13 becomes conductive, and transistor 12 becomes nonconductive, a current flows from the gate of transistor 22 through transistor 13 and through resistor 14. The current causes a voltage drop to occur between resistor 14 and $V_{SS}$, and this voltage drop decreases the gate-to-source voltage on transistor 13. The decreased gate-to-source voltage on transistor 13 momentarily keeps the transistor in a saturation region, in which the current through the transistor is proportional to the gate-to-source voltage. This phenomenon slows the rate at which transistor 22 becomes nonconductive, reducing di/dt.

Also, D2 switches to a logic low and ultimately makes transistor 16 conductive and transistor 17 nonconductive. Resistor 15 similarly reduces the gate-to-source voltage on transistor 16 while current is flowing. Resistor 15 momentarily keeps transistor 16 in the saturation region, and keeps transistor 24 from becoming conductive as quickly as if no resistors were present.

In a typical embodiment, the integrated circuit is required to operate with a voltage on $V_{DD}$ between 4.5 volts and 5.5 volts while $V_{SS}$ is 0 volts, an input low voltage, VIL, at a maximum of 0.8 volts, and an input high voltage, VIH, at a minimum of 2.2 volts. An Ldi/dt voltage drop will be reflected on internal $V_{DD}$ and $V_{SS}$ terminals during switching, causing these voltages to depart from their external values and thresholds of input stage transistors to change. If the Ldi/dt voltage drop approaches VIH minus an internal switch level for Ldi/dt on $V_{SS}$, or $V_{DD}$ minus VIL minus the internal switch level for Ldi/dt on $V_{DD}$, a corresponding transistor on an input signal may fail to switch and to recognize the input signal in a particular state. Alternatively, if an input signal has assumed a steady-state value, an Ldi/dt voltage drop may cause the input transistor to switch incorrectly as if the input were chaning state. A smaller Ldi/dt voltage drop on $V_{SS}$ is necessary to cause an incorrect result than on $V_{DD}$. Thus, switching to a logic low presents the worst case condition for di/dt. Whenever either a logic high input or a logic low input fails to be recognized, the whole circuit malfunctions.

While output buffer 35 provides a way to avoid integrated circuit malfunctions by using resistors 11, 14, 15, and 18 to reduce di/dt, it also suffers a disadvantage, especially in circuits in which speed is critical. When $V_{DD}$ decreases, a delay, from receiving D1 and D2 until the output signal is valid, increases. Since a worst case condition for speed of the remainder of the internal circuitry of the chip occurs at lowest $V_{DD}$, 4.5 volts, the increased delay of the output buffer worsens the overall worst case delay of the chip.

BRIEF DESCRIPTION OF THE INVENTION

Accordingly, it is an object of the present invention to provide a low di/dt output buffer circuit with improved speed.

It is another object to present an apparatus for improving speed of an integrated circuit while providing for di/dt control.

In carrying out these and other objects of the invention, there is provided, in one form, an output buffer in an integrated circuit comprising voltage regulator means, a predriver, and an output stage. The integrated circuit comprises a chip and a package and interconnections therebetween. The voltage regulator means is coupled to a first power supply voltage terminal and a second power supply voltage terminal, and provides a regulated voltage signal characterized as having a constant voltage substantially independent of fluctuations between the first power supply voltage terminal and the second power supply voltage terminal. The predriver means receives the regulated voltage signal and a data input signal and provides a regulated predriven signal in response to the data signal. The output stage is coupled to the first power supply voltage terminal and the second power supply voltage terminal receives the regulated predriven signal and provides an output signal in response thereto. The output signal is driven onto a bonding pad of the device to provide an interconnection point between the chip and the package.

These and other objects, features and advantages will be more clearly understood from the following detailed description taken in conjunction with the accompanying drawings.

BRIEF DESCRIPTION OF THE DRAWINGS

FIG. 2 shows a combined circuit diagram and block diagram of the present invention; and FIG. 3 shows in circuit diagram form a voltage regulator used in conjunction with the present invention.

DETAILED DESCRIPTION OF THE INVENTION

Figure 1:
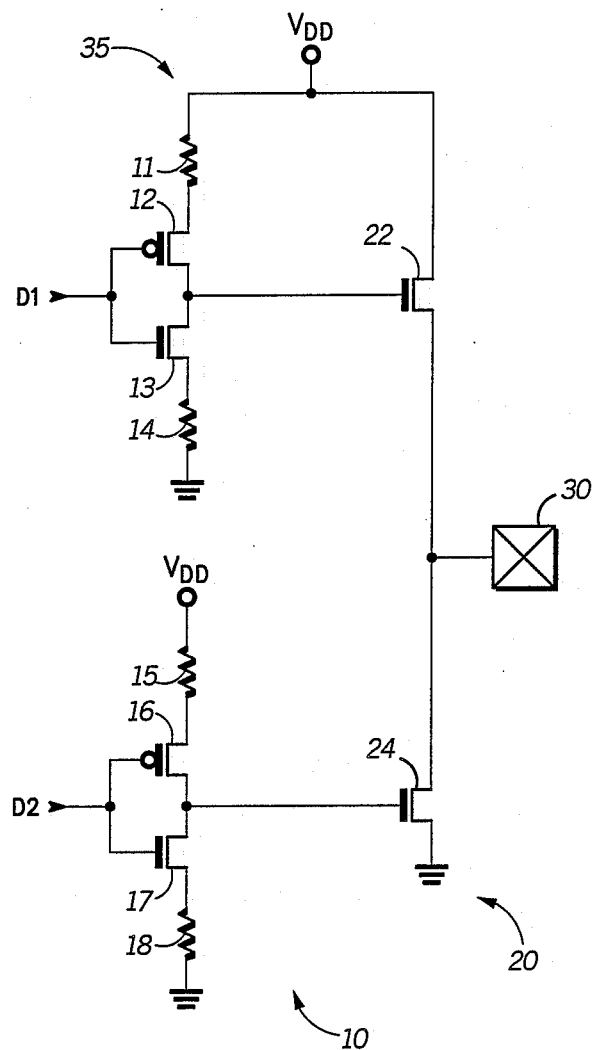
FIG. 1 illustrates in schematic form a circuit diagram of a prior art method of implementing di/dt control.

FIG. 2 shows a combined circuit diagram and block diagram of an output buffer in accordance with the present invention. FIG. 2 generally comprises an output buffer 75 and a bonding pad 70. Output buffer 75 comprises a predriver 40, an output stage 50, and a pullup driver 60. Predriver 40 comprises a P-channel transistor 42, an N-channel transistor 43, a resistor 44, a voltage regulator 45, a P-channel transistor 46, an N-channel transistor 47, a resistor 48, and a voltage regulator 49. Output stage 50 comprises an N-channel transistor 52 and an N-channel transistor 54. Pullup driver 60 comprises a P-channel transistor 62, an N-channel transistor 64, and a P-channel transistor 66.

Voltage regulator 45 provides a first regulated voltage signal, designated $V_{R1}$. Transistor 42 has a source for receiving $V_{R1}$, a gate for an receiving input signal D1, and a drain providing a first regulated predriven signal. Transistor 43 has a drain connected to the drain of transistor 42, a gate for receiving input signal D1, and a source. Resistor 44 has a first terminal connected to the source of transistor 43 and a second terminal connected to a negative power supply voltage terminal $V_{SS}$, which may be, for example, ground. Voltage regulator 49 provides a second regulated voltage signal, designated $V_{R2}$. Transistor 46 has a source for receiving $V_{R2}$, a gate for receiving an input signal D2, and a drain providing a second regulated predriven signal. Transistor 47 has a drain connected to the drain of transistor 46, a gate for receiving D2, and a source. Resistor 48 has a first terminal connected to the source of transistor 47, and a second terminal connected to $V_{SS}$.

In output stage 50, transistor 52 has a drain connected to a positive power supply voltage terminal $V_{DD}$, which may be, for example, 5 volts, a gate for receiving the first regulated predriven signal, and a source connected to bonding pad 70 and providing an output signal thereon. Transistor 54 has a drain connected to the source of transistor 52 and to bonding pad 70, a gate for receiving the second regulated predriven signal, and a source connected to $V_{SS}$.

In pullup driver 60, transistor 62 has a source connected to $V_{DD}$, a gate for receiving the first regulated predriven signal, and a drain. Transistor 64 has a drain connected to the drain of transistor 62, a gate for receiving the first regulated predriven signal, and a source connected to $V_{SS}$. Transistor 66 has a source connected to $V_{DD}$, a gate connected to the drain of transistor 62, and a drain connected to bonding pad 70.

In operation, output buffer 75 receives two input signals and provides one output signal on bonding pad 70 in response. In a preferred embodiment, signals D1 and D2 are driven to a logic high when the output buffer is disabled, and are complementary when the output buffer is enabled. When the output buffer is enabled by either D1 or D2 being at a logic low, the output signal driven onto bonding pad 70 assumes a steady-state value after a finite period of time.

Output buffer 75 functions as a digital circuit. If D1 is a logic high, transistor 42 is nonconductive and transistor 43 is conductive, driving the first regulated predriven signal to a logic low and putting a low voltage on the gates of transistors 62, 64, and 52. The low voltage makes transistors 64 and 52 nonconductive and transistor 62 conductive. Transistor 62 conducts and drives the gate of transistor 66 to a logic high, making transistor 66 nonconductive. So if D1 is a logic high, transistors 66 and 52 are isolated and do not provide the output signal on bonding pad 70. If D1 is a logic low, transistor 43 is nonconductive, and transistor 42 is conductive and provides a high voltage on the gates of transistors 62, 64, and 52. The high voltage makes transistor 62 nonconductive and transistor 64 conductive, which drives a low voltage on the gate of transistor 66 and makes transistor 66 conductive. The high voltage on the gate of transistor 52 makes transistor 52 conductive. Transistors 52 and 66 conduct and drive the output signal to a logic high on bonding pad 70. Pullup driver 60 adds another conductive path between $V_{DD}$ and bonding pad 70 and helps to maintain a specified voltage on bonding pad 70 when the output signal is a logic high.

If D2 is a logic high, transistor 46 is nonconductive and transistor 47 is conductive, driving the first regulated predriven signal to a logic low and placing a logic low on the gate of transistor 54. The logic low on the gate of transistor 54 makes transistor 54 nonconductive. So if D2 is a logic high, transistor 54 is isolated and does not drive the output signal onto bonding pad 70. If D2 is a logic low, transistor 47 is nonconductive and transistor 46 is conductive, providing a logic high onto the gate of transistor 54. The logic high on the gate of transistor 54 makes transistor 54 conductive, and drives the output signal to a logic low on bonding pad 70.

In steady-state operation, if D1 and D2 are both a logic high, each of the transistors connected to bonding pad 70, transistors 66, 52, and 54, are nonconductive and place the output buffer in the high impedance state. If D1 is a logic low and D2 is a logic high, transistors 52 and 66 conduct and transistor 54 does not conduct, driving the output signal to a logic high. If D1 is a logic high and D2 is a logic low, transistors 66 and 52 do not conduct and transistor 54 conducts, driving the output signal to a logic low. If both D1 and D2 were a logic low, transistors 66, 52, and 54 would all conduct and would cause a virtual short between $V_{DD}$ and $V_{SS}$. Thus, D1 and D2 should not simultaneously be at a logic low.

The present invention offers an improvement over output buffer 35 of FIG. 1 by providing the same value for worst case di/dt, and lowering the delay in the worst case. Output buffer 75 limits worst case di/dt through the use of regulated power supply voltages $V_{R1}$ and $V_{R2}$ in predriver 40. As in output buffer 35 of FIG. 1, the worst case condition for di/dt occurs when the output signal on bonding pad 70 switches from a logic high to a logic low. In this case, transistors 46 and 54 conduct and operation is determined by the voltage $V_{R2}$. When D2 is a logic low, transistor 46 conducts, and drives the voltage on its drain electrode and the gate of transistor 54 to approximately $V_{R2}$. $V_{R2}$ is substantially less than $V_{DD}$ and substantially greater than $V_{SS}$, and in the preferred embodiment is approximately 3 volts. The maximum current through transistor 54 when transistor 54 conducts is a function of the gate-to-source voltage. The maximum current through transistor 54 can be reduced by making $V_{R2}$ lower than $V_{DD}$. The time from when transistor 54 begins to conduct until the maximum current flows, is substantially constant, independent of the maximum gate-to-source voltage. The time rate of change of current, or di/dt, is equal to the maximum current divided by the time it takes to reach the maximum value. Therefore di/dt is less with $V_{R2}$ driven on the source of transistor 46 than with $V_{DD}$, and is a function of regulated voltage $V_{R2}$.

Output buffer 75 improves the worst case delay over output buffer 35 of FIG. 1. A regulated voltage is, by definition, one that does not significantly change with changes in input supply voltage, $V_{DD}$ in the present invention. At lower $V_{DD}$, the voltages on the source of transistor 42 and the source of transistor 46 remain constant due to regulated supply voltages $V_{R1}$ and $V_{R2}$. Therefore the delay through predriver 40 at $V_{DD}=4.5$ volts is substantially the same as when $V_{DD}=5.5$ volts, whereas the delay through predriver 10 of output buffer 35, as noted earlier, is longer at 4.5 volts than at 5.5 volts.

Since the worst case for di/dt occurs when the output signal switches to a low voltage, regulated voltage source $V_{R1}$ may be replaced with $V_{DD}$ in another possible embodiment without altering the basic advantage of the circuit. In the present embodiment, $V_{R2}$ can be chosen such that the maximum di/dt, which occurs at highest voltage on $V_{DD}$, is no worse than that of output buffer 35 of FIG. 1, and at the same time, delay is lower. Alternatively, in circuits in which speed is not critical, $V_{R1}$ and $V_{R2}$ can be chosen so that the delay is the same as output buffer 35 of FIG. 1 in the worst case, but worst case di/dt is improved. In the preferred embodiment, the value chosen for both $V_{R1}$ and $V_{R2}$, which keeps the worst case di/dt the same as the prior art circuit of FIG. 1 and decreases delay, is approximately 3 volts.

Shown in FIG. 3 is a voltage regulator used in the present invention, which is well known in the art (Gray, Paul R. and Meyer, Robert G., *Analysis and Design of Integrated Circuits*. Wiley, N.Y., 1977, pp. 258-260). The voltage regulator of FIG. 3 is used as voltage regulator 45 and voltage regulator 49 of FIG. 2. Other voltage regulators that maintain a regulated voltage output constant with changes in $V_{DD}$ may be used instead of the one shown in FIG. 3.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

We claim:

1. In an integrated circuit, an output buffer for providing an output signal to said integrated circuit, comprising:
   voltage regulator means, coupled to a first power supply voltage terminal and a second power supply voltage terminal, for providing a regulated voltage signal characterized as having a constant voltage substantially independent of fluctuations between the first power supply voltage terminal and the second power supply voltage terminal;
   a predriver, said predriver having a positive power supply input terminal and a negative power supply input terminal, wherein said positive power supply terminal is coupled to the regulated voltage signal, and said negative power supply terminal is coupled to the second power supply voltage terminal, said predriver providing a regulated predriven signal in response to an input signal; and an output stage coupled to said first power supply voltage terminal and to said second power supply voltage terminal, said output stage receiving the regulated predriven signal and providing said output signal in response thereto.

2. The output buffer of claim 1, wherein said output signal is coupled to a bonding pad, said bonding pad providing a point for connection external to the integrated circuit.

3. An output buffer for a high speed integrated circuit, said output buffer receiving a first input signal and a second input signal and providing an output signal external to said high speed integrated circuit, comprising:

first voltage regulator means, coupled to a first power supply voltage terminal and a second power supply voltage terminal, for providing a first regulated voltage signal characterized as having a constant voltage substantially independent of fluctuations between the first power supply voltage terminal and the second power supply voltage terminal;

second voltage regulator means, coupled to the first power supply voltage terminal and the second power supply voltage terminal, for providing a second regulated voltage signal characterized as having a constant voltage substantially independent of fluctuations between the first power supply voltage terminal and the second power supply voltage terminal;

a first predriver, said first predriver having a positive power supply input terminal and a negative power supply input terminal, wherein said positive power supply terminal is coupled to a first regulated voltage signal, and said negative power supply terminal is coupled to the second power supply voltage terminal, said first predriver providing a first regulated predriven signal in response to a first input signal;

a second predriver, said second predriver having a positive power supply input terminal and a negative power supply input terminal, wherein said positive power supply terminal is coupled to a second regulated voltage signal, and said negative power supply terminal is coupled to the second power supply voltage terminal, said second predriver providing a second regulated predriven signal in response to a second input signal; and an output stage, said output stage receiving the first regulated predriven signal and the second regulated predriven signal and providing said output signal in response thereto.

4. The output buffer of claim 3, wherein said first predriver comprises:

a first transistor having a first current electrode for receiving the first regulated voltage signal, a control electrode for receiving the first input signal, and a second current electrode for providing a first regulated predriven signal;

a second transistor having a first current electrode connected to the second current electrode of the first transistor, a control electrode for receiving the first input signal, and a second current electrode; and a first resistor having a first terminal connected to the second current electrode of the second transistor and a second terminal coupled to the second power supply voltage terminal.

5. The output buffer of claim 3, wherein said second predriver comprises:

a third transistor having a first current electrode for receiving the second regulated voltage signal, a control electrode for receiving the second input signal, and a second current electrode for providing a second regulated predriven signal;

a fourth transistor having a first current electrode connected to the second current electrode of the third transistor, a control electrode for receiving the second input signal, and a second current electrode; and a second resistor having a first terminal connected to the second current electrode of the fifth transistor and a second terminal coupled to the second power supply voltage terminal.

6. The output buffer of claim 3 wherein said output stage comprises:

a fifth transistor having a first current electrode coupled to the first power supply voltage terminal, a control electrode for receiving the first regulated predriven signal, and a second current electrode for supplying an output signal;

a sixth transistor having a first current electrode connected to the second terminal of the fifth transistor, a control electrode for receiving the second regulated predriven signal, and a second current electrode coupled to the second power supply voltage terminal.

7. An output buffer for a high speed integrated circuit, said output buffer receiving a first input signal and a second input signal and providing an output signal external to said high speed integrated circuit, comprising:

voltage regulator means, coupled to a first power supply voltage terminal and a second power supply voltage terminal, for providing a regulated voltage signal characterized as having a constant voltage substantially independent of fluctuations between the first power supply voltage terminal and the second power supply voltage terminal;

a first transistor having a first current electrode for receiving the regulated voltage signal, a control electrode for receiving the first input signal, and a second current electrode for providing a first regulated predriven signal;

a second transistor having a first current electrode connected to the second current electrode of the first transistor, a control electrode for receiving the first input signal, and a second current electrode;

a first resistor having a first terminal connected to the second current electrode of the second transistor and a second terminal coupled to the second power supply voltage terminal;

a third transistor having a first current electrode coupled to the first power supply voltage terminal, a control electrode for receiving the first regulated predriven signal, and a second current electrode for supplying an output signal;

a fourth transistor having a first current electrode for receiving the regulated voltage signal, a control electrode for receiving the second input signal, and a second current electrode for providing a second regulated predriven signal;

a fifth transistor having a first current electrode connected to the second current electrode of the fourth transistor, a control electrode for receiving the second input signal, and a second current electrode;

a second resistor having a first terminal connected to the second current electrode of the fifth transistor and a second terminal coupled to the second power supply voltage terminal;

a sixth transistor having a first current electrode connected to the second terminal of the third transistor, a control electrode for receiving the second regulated predriven signal, and a second current electrode coupled to the second power supply voltage terminal.

8. The output buffer of claim 7, wherein said output signal is coupled to a bonding pad, said bonding pad providing a point for connection external to the high speed integrated circuit.

9. In an integrated circuit comprising a chip and a package and interconnections therebetween, wherein said chip comprises functional circuitry, wherein a bonding pad provides an interconnection point between the functional circuitry and the package, an output buffer in the functional circuitry, comprising:

voltage regulator means, coupled to a first power supply voltage terminal and a second power supply voltage terminal, for providing a regulated voltage signal characterized as having a constant voltage substantially independent of fluctuations between the first power supply voltage terminal and the second power supply voltage terminal;

predriver means for receiving the regulated voltage signal and a data input signal, and providing a regulated predriven signal in response to the data input signal; and an output stage coupled to said first power supply voltage terminal and to said second power supply voltage terminal, said output stage receiving the regulated predriven signal and providing an output signal on the bonding pad in response thereto.

10. The output buffer of claim 9, wherein said predriver means comprises:

a first transistor having a first current electrode for receiving the regulated voltage signal, a control electrode for receiving the data input signal, and a second current electrode for providing a first regulated predriven signal;

a second transistor having a first current electrode connected to the second current electrode of the first transistor, a control electrode for receiving the data input signal, and a second current electrode; and a first resistor having a first terminal connected to the second current electrode of the second transistor and a second terminal coupled to the second power supply voltage terminal.

11. The output buffer of claim 9 wherein said output stage comprises a third transistor having a first current electrode coupled to said bonding pad, a control electrode coupled to the second current electrode of the first transistor, and a second current electrode coupled to the second power supply voltage terminal.

* * * * *